(12) United States Patent
Kim et al.

(10) Patent No.: US 11,715,697 B2
(45) Date of Patent: Aug. 1, 2023

(54) SEMICONDUCTOR PACKAGES INCLUDING AT LEAST ONE SUPPORTING PORTION

(71) Applicant: Samsung Electronics Co., Ltd., Suwon-si (KR)

(72) Inventors: Sungbum Kim, Cheonan-si (KR); Taewoo Kang, Suwon-si (KR); Jaewon Choi, Daegu (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/096,107

(22) Filed: Nov. 12, 2020

(65) Prior Publication Data

US 2021/0183780 A1 Jun. 17, 2021

(30) Foreign Application Priority Data

Dec. 13, 2019 (KR) ........................ 10-2019-0167132

(51) Int. Cl.
*H01L 23/538* (2006.01)
*H01L 23/31* (2006.01)
*H01L 23/498* (2006.01)

(52) U.S. Cl.
CPC ...... *H01L 23/5386* (2013.01); *H01L 23/3107* (2013.01); *H01L 23/49816* (2013.01)

(58) Field of Classification Search
CPC ..... H01L 24/42; H01L 2224/42–49505; H01L 2224/85–85986; H01L 23/5385; H01L 25/0657; H05K 2201/10568; H05K 2201/2036
See application file for complete search history.

(56) References Cited

U.S. PATENT DOCUMENTS

| 7,071,568 | B1* | 7/2006 | St. Amand | .......... H01L 25/0657 |
| | | | | 438/109 |
| 8,012,797 | B2* | 9/2011 | Shen | .................. H01L 23/3128 |
| | | | | 438/107 |
| 8,178,936 | B2 | 5/2012 | Zhe et al. | |
| 8,304,876 | B2 | 11/2012 | Byun et al. | |
| 8,723,302 | B2* | 5/2014 | Chandra | .............. H01L 25/105 |
| | | | | 438/109 |
| 8,728,866 | B2 | 5/2014 | Kanaya et al. | |
| 8,836,102 | B2 | 9/2014 | Okada | |

(Continued)

FOREIGN PATENT DOCUMENTS

KR 10-1607981 B1 3/2016

*Primary Examiner* — Bradley Smith
*Assistant Examiner* — William H Anderson
(74) *Attorney, Agent, or Firm* — Harness, Dickey & Pierce, P.L.C.

(57) ABSTRACT

A semiconductor package may include a lower package including a first substrate, a first semiconductor chip on the first substrate, and a first molding portion on the first substrate to cover the first semiconductor chip, an interposer substrate on the first semiconductor chip, a supporting portion between the interposer substrate and the first substrate to support the interposer substrate, a connection terminal connecting the interposer substrate to the first substrate, and an upper package on the interposer substrate. The upper package may include a second substrate, a second semiconductor chip on the second substrate, and a second molding portion on the second substrate to cover the second semiconductor chip.

19 Claims, 15 Drawing Sheets

(56) References Cited

U.S. PATENT DOCUMENTS

| | | |
|---|---|---|
| 9,196,557 B1 | 11/2015 | Bi et al. |
| 9,245,772 B2 | 1/2016 | Yang et al. |
| 2006/0115928 A1* | 6/2006 | Nguyen .............. H01L 25/0657 |
| | | 257/E21.705 |
| 2007/0181990 A1* | 8/2007 | Huang .................. H01L 21/565 |
| | | 438/109 |
| 2007/0246815 A1* | 10/2007 | Lu ........................... H01L 24/73 |
| | | 257/686 |
| 2007/0278640 A1* | 12/2007 | Weng .................. H01L 23/3135 |
| | | 257/E23.085 |
| 2008/0290491 A1* | 11/2008 | Yamano ................ H01L 25/105 |
| | | 257/773 |
| 2009/0032926 A1* | 2/2009 | Sharifi .................... H01L 24/85 |
| | | 257/E21.705 |
| 2009/0236731 A1* | 9/2009 | Shim ..................... H01L 25/105 |
| | | 257/E23.19 |
| 2015/0125993 A1 | 5/2015 | Lee et al. |
| 2020/0118972 A1* | 4/2020 | Lee ......................... H01L 24/49 |
| 2020/0126919 A1* | 4/2020 | Kang .................. H01L 23/3121 |

\* cited by examiner

SEMICONDUCTOR PACKAGES INCLUDING AT LEAST ONE SUPPORTING PORTION

CROSS-REFERENCE TO RELATED APPLICATION

This U.S. non-provisional patent application claims priority under 35 U.S.C. § 119 to Korean Patent Application No. 10-2019-0167132, filed on Dec. 13, 2019, in the Korean Intellectual Property Office, the entire contents of which are hereby incorporated by reference.

BACKGROUND

The present disclosure relates to semiconductor packages, and in particular, to semiconductor packages including an interposer.

In the case where an integrated circuit (IC) chip is provided in the form of a semiconductor package, the IC chip can be easily used as a part of an electronic product. In general, a semiconductor package includes a printed circuit board (PCB) and a semiconductor chip, which is mounted on the PCB and is electrically connected to the PCB by bonding wires or bumps.

In the semiconductor industry, there are increasing demands for semiconductor devices with high-performance, high-speed, and compact size and electronic products therewith. To meet such demands, technologies of stacking multiple semiconductor chips on a single substrate or stacking a semiconductor package on another semiconductor package have been suggested.

SUMMARY

Some example embodiments relate to a package-on-package (PoP) technology of vertically stacking semiconductor chips to realize a high-density chip stacking structure. According to the PoP technology, it is possible to integrate various semiconductor chips within an area which is smaller than that in a general packaging structure composed of a single semiconductor chip.

Some example embodiments of the inventive concepts provides a semiconductor package with improved structural stability and a method of fabricating the same.

According to some example embodiments of the inventive concepts, a semiconductor package may include a lower package including a first substrate, a first semiconductor chip on the first substrate, and a first molding portion on the first substrate such that the first molding portion covers the first semiconductor chip. The semiconductor package may include an interposer substrate on the first semiconductor chip. The semiconductor package may include a supporting portion between the interposer substrate and the first substrate to support the interposer substrate on the first substrate. The semiconductor package may include a connection terminal connecting the interposer substrate to the first substrate. The semiconductor package may include an upper package on the interposer substrate, the upper package including a second substrate on the interposer substrate, a second semiconductor chip on the second substrate, and a second molding portion on the second substrate such that the second molding portion covers the second semiconductor chip.

According to some example embodiments of the inventive concepts, a semiconductor package may include a first substrate, a first semiconductor chip on the first substrate, an interposer substrate on the first semiconductor chip, an upper package on the interposer substrate, and coupling terminals between the upper package and the interposer substrate. The interposer substrate may include a first supporting portion, which is extended from an outer region of the interposer substrate toward the first substrate to support the interposer substrate on the first substrate. The first supporting portion may be isolated from direct contact with a side surface of the first semiconductor chip.

According to some example embodiments of the inventive concepts, a semiconductor package may include a lower package including a first substrate, a first semiconductor chip mounted on the first substrate, and a first molding portion on the first substrate such that the first molding portion covers the first semiconductor chip. The semiconductor package may include an interposer substrate on the first semiconductor chip. The semiconductor package may include an upper package on the interposer substrate, the upper package including a second substrate on the interposer substrate, a second semiconductor chip on the second substrate, and a second molding portion on the second substrate such that the second molding portion covers the second semiconductor chip. The semiconductor package may include a connection terminal between the interposer substrate and the second substrate to connect the upper package to the interposer substrate. The semiconductor package may include a bonding wire connecting the interposer substrate to the first substrate. The first substrate may include a first supporting portion extending from a top surface of the first substrate toward an outer region of the interposer substrate. The interposer substrate may include a second supporting portion, which extends from the outer region of the interposer substrate toward the first substrate and is in contact with a top surface of the first supporting portion.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Some example embodiments of the inventive concepts will now be described more fully with reference to the accompanying drawings, in which some example embodiments are shown.

Figure 1:
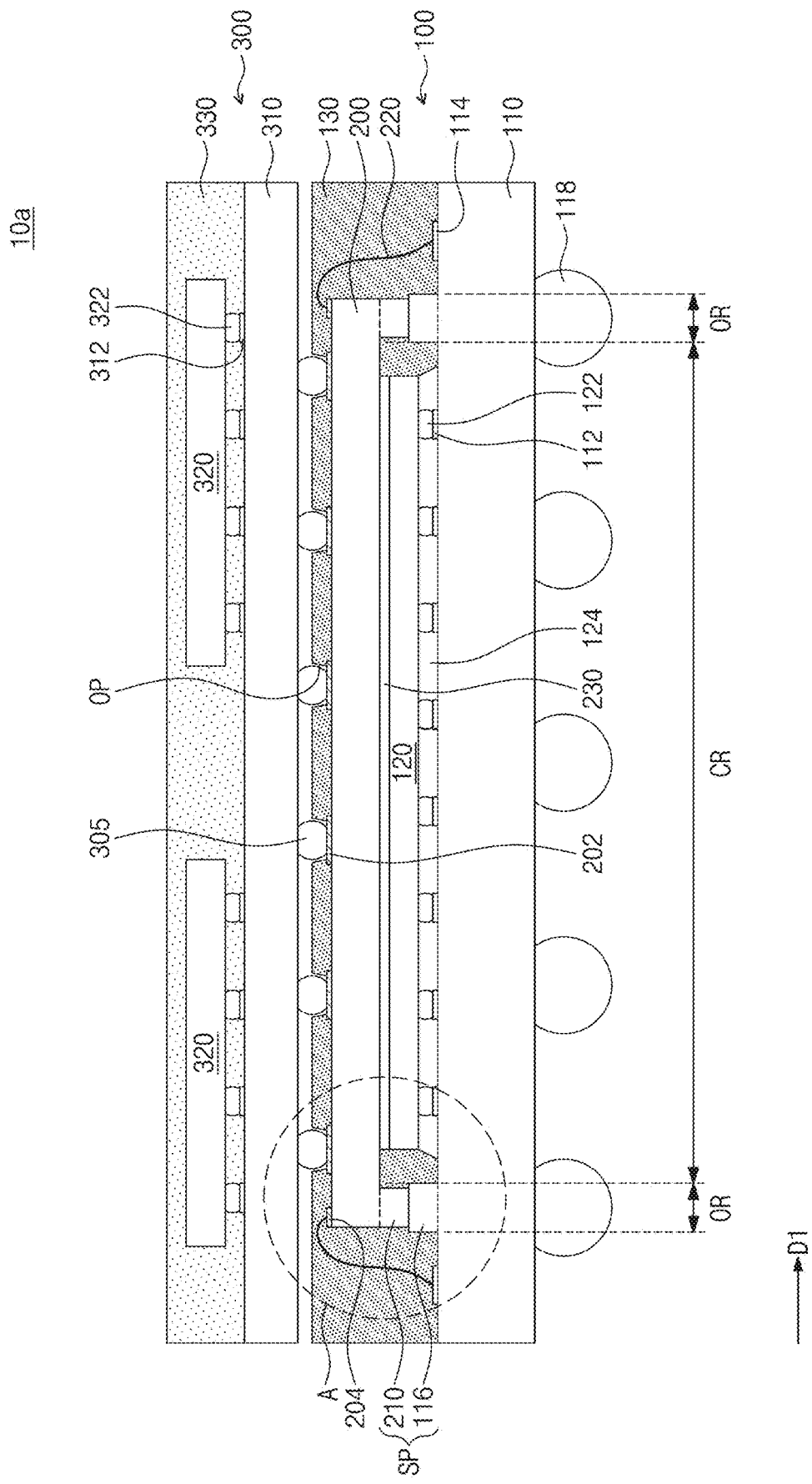
FIG. 1 is a sectional view illustrating a semiconductor package according to some example embodiments of the inventive concepts.
Figure 2:
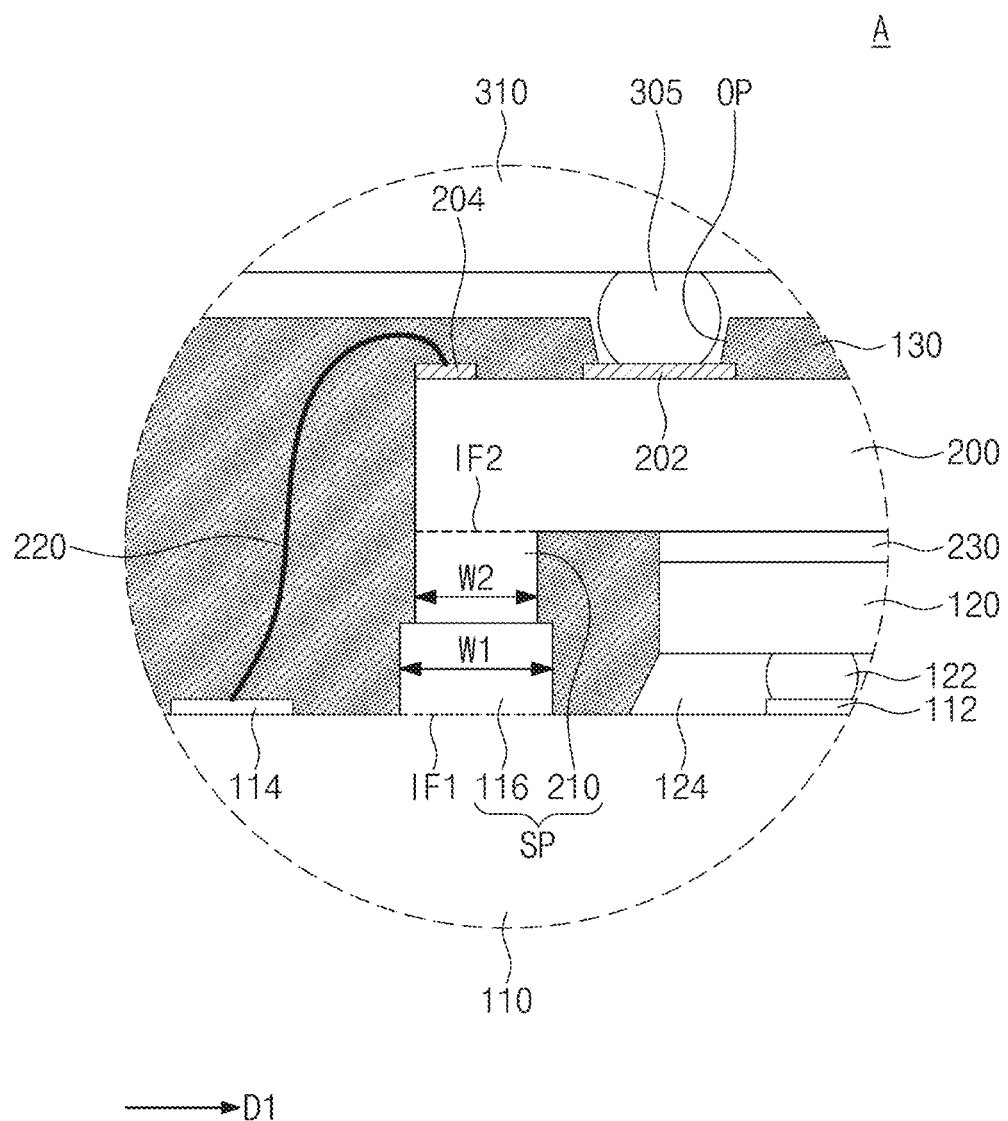
FIGS. 2, 3, and 4 are enlarged sectional views, each of which illustrates a region A of FIG. 1.
Figure 3:
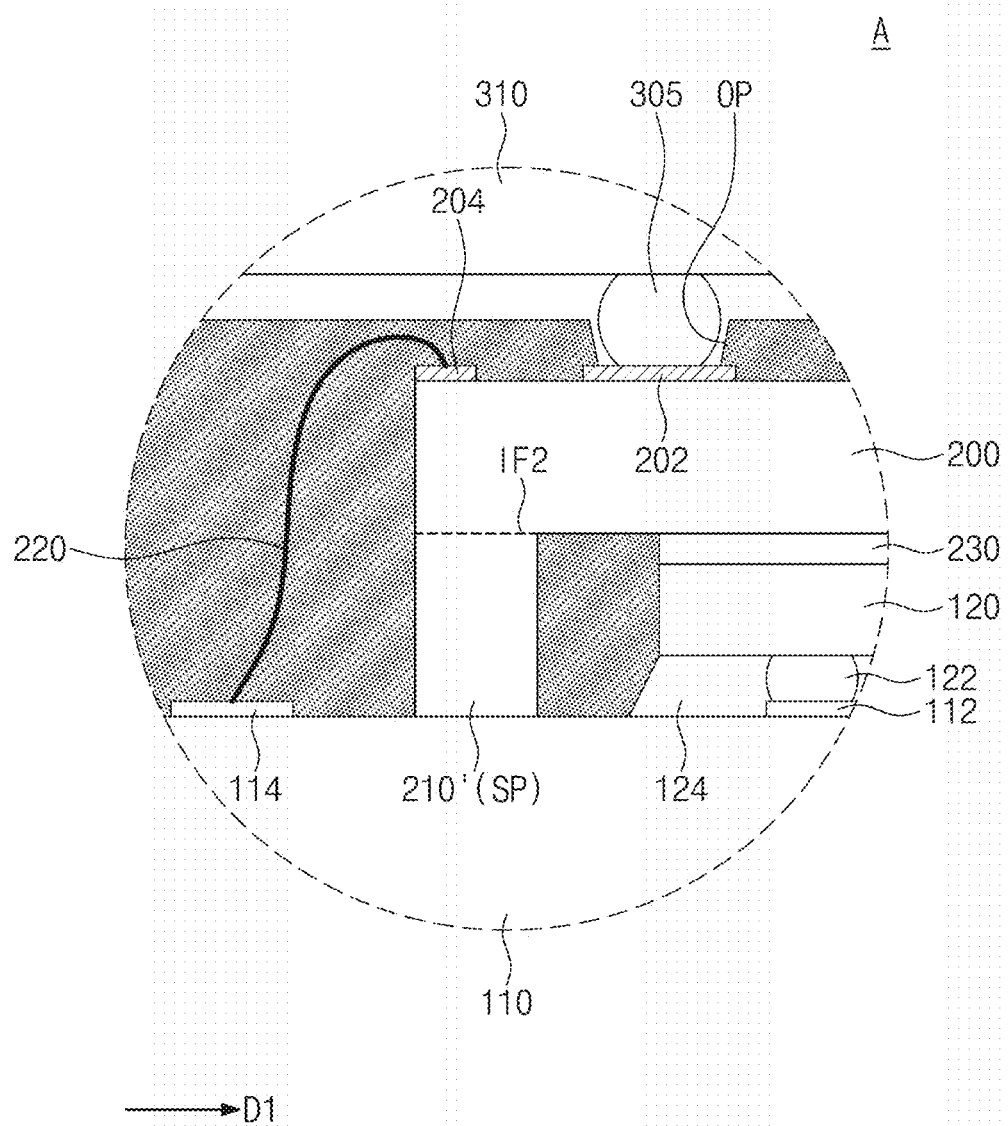
Figure 4:
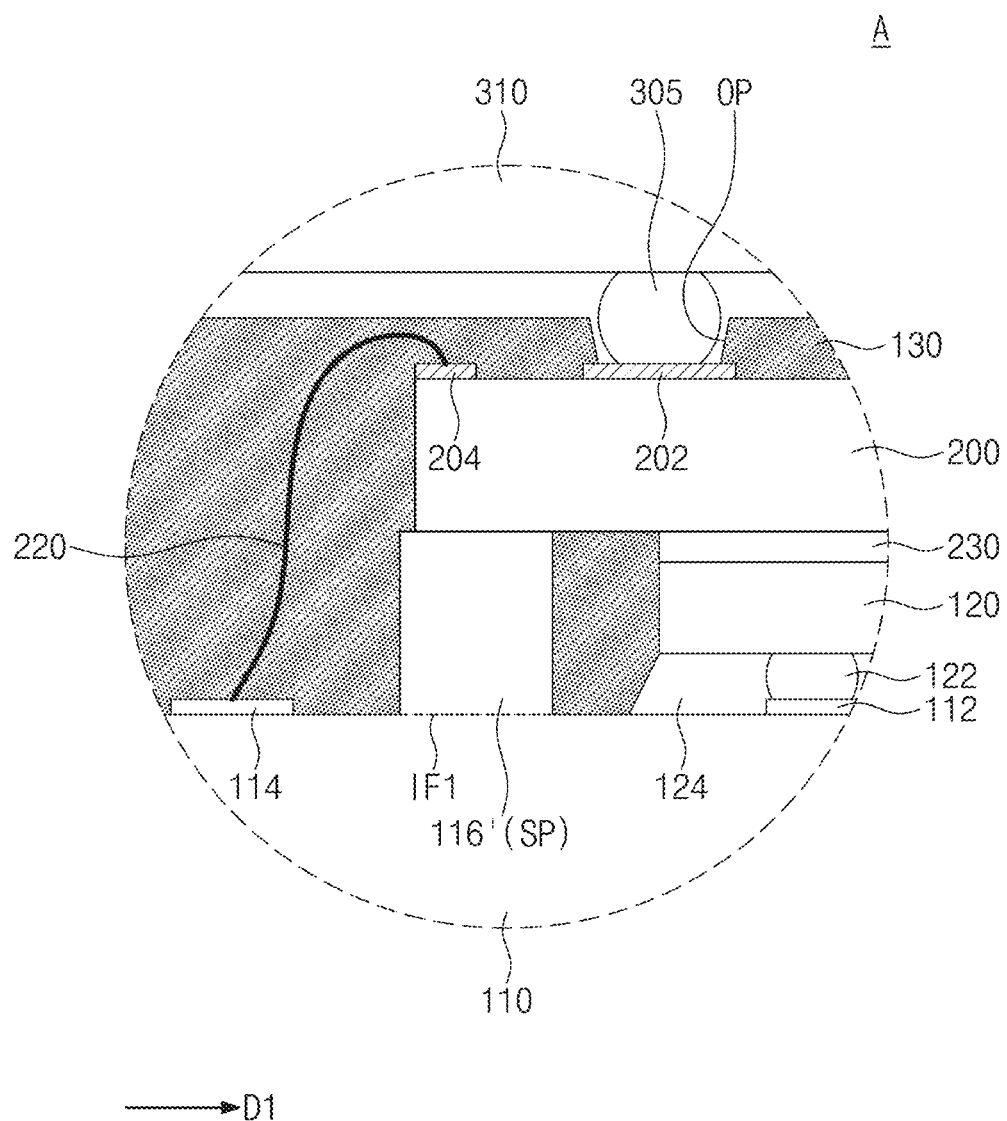
Figure 5:
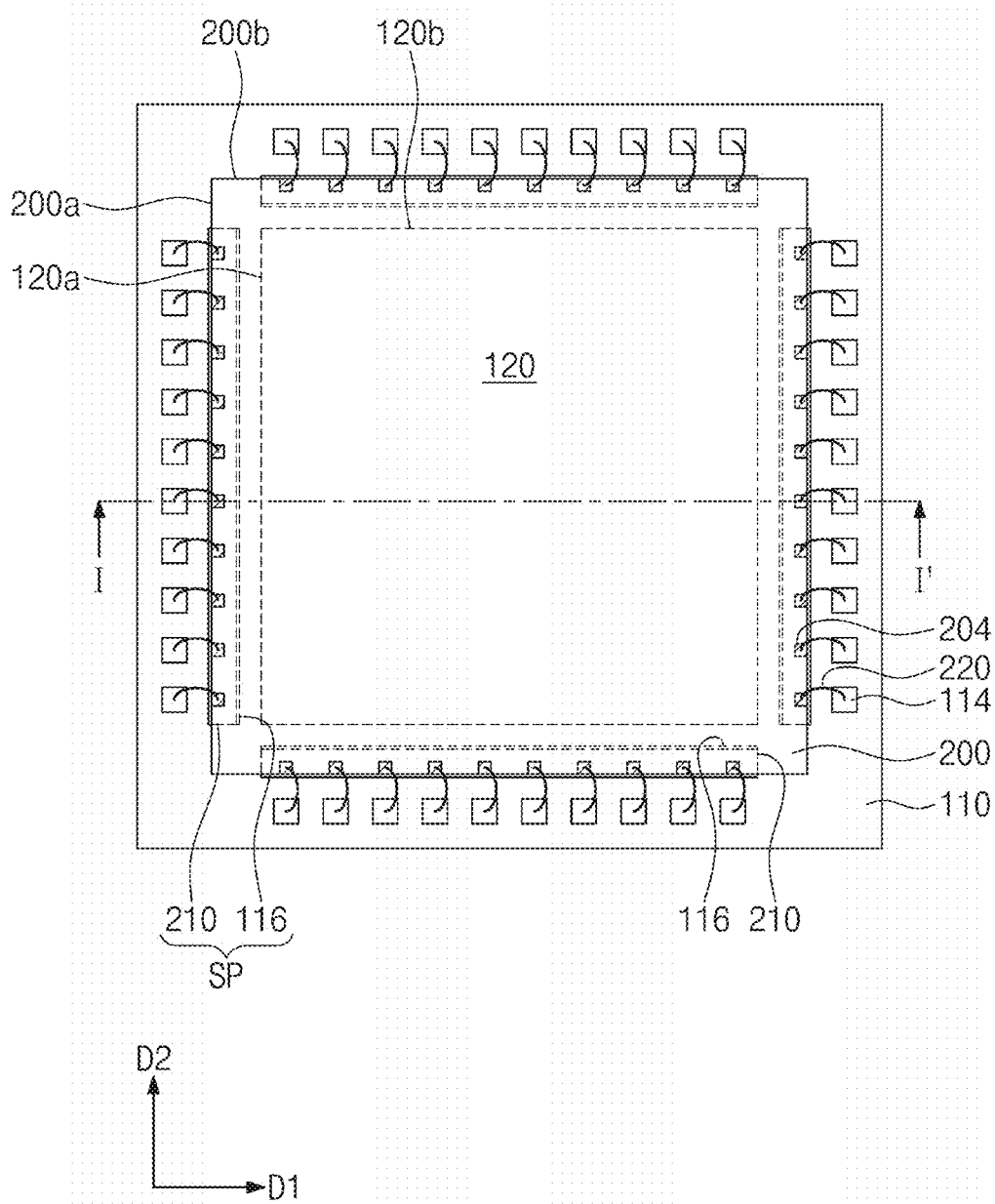
FIGS. 5, 6, and 7 are plan views, each of which illustrates a semiconductor package according to some example embodiments of the inventive concepts.
Figure 6:
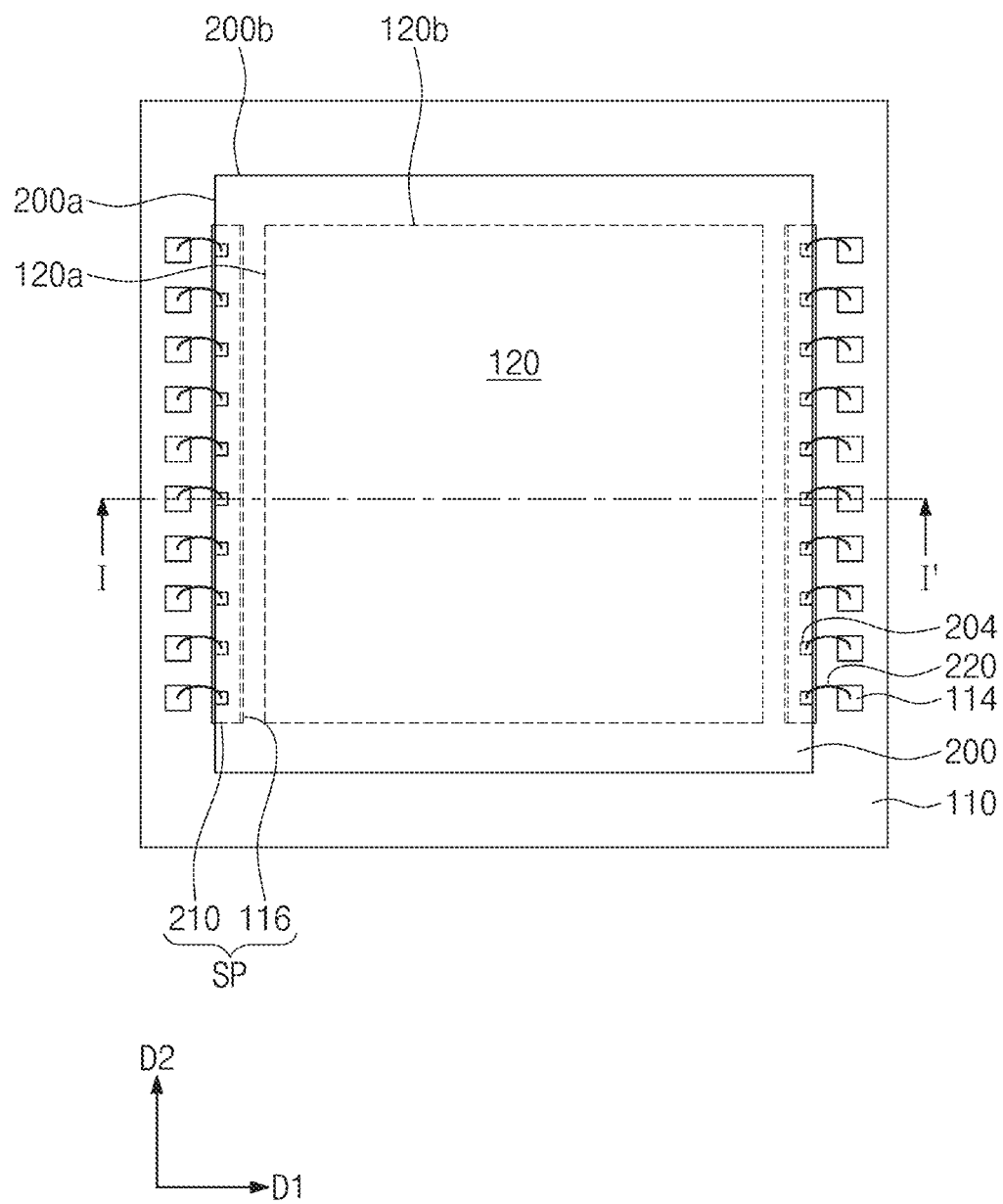
Figure 7:
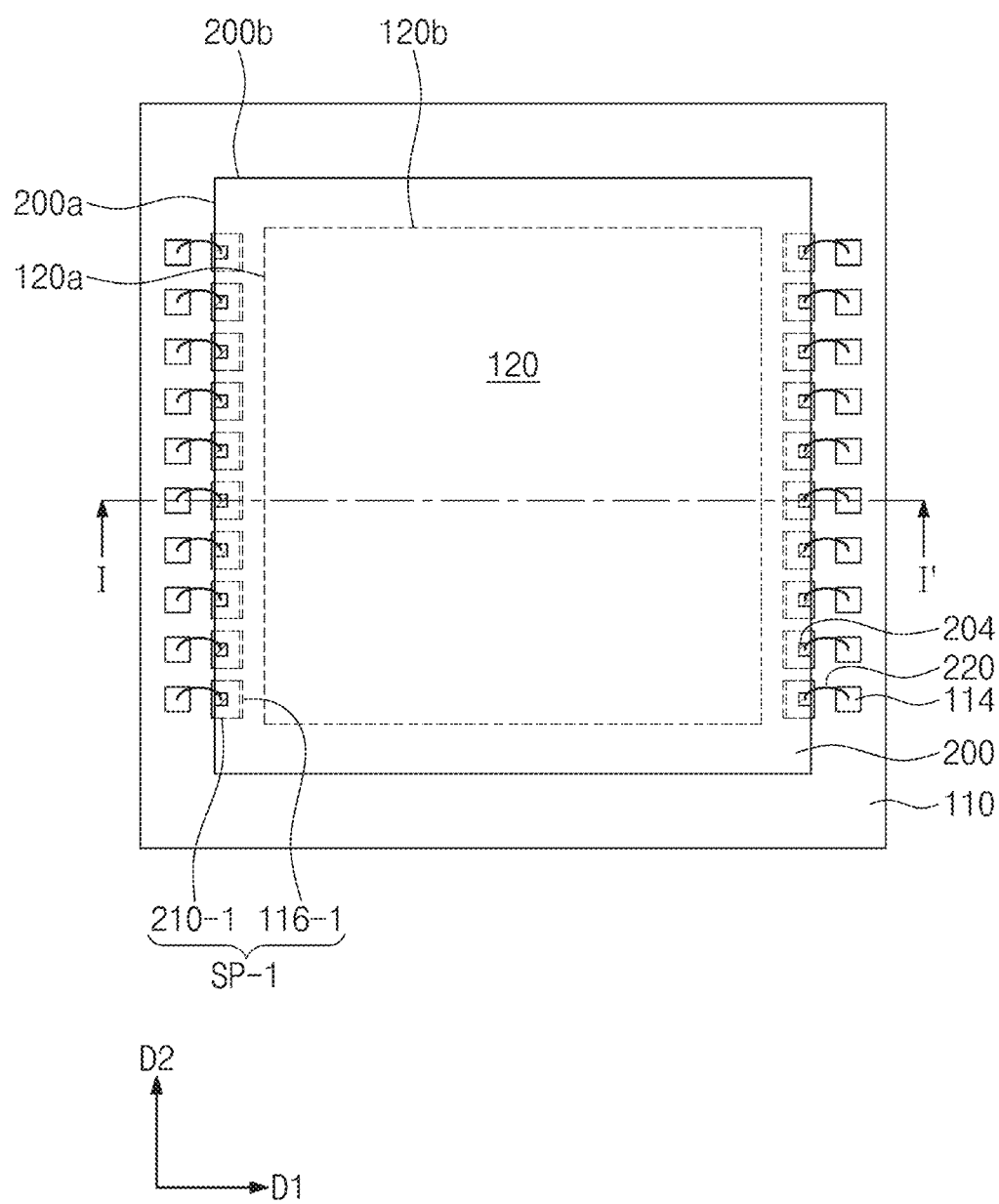
Figure 8:
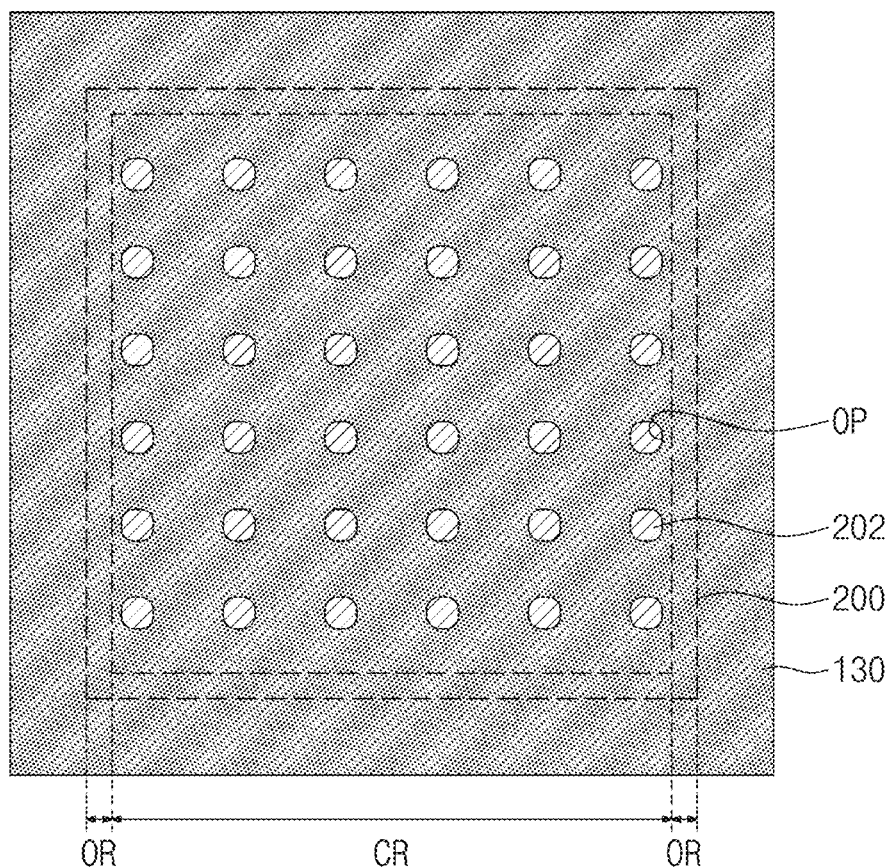
FIG. 8 is a plan view illustrating a first molding portion of FIG. 1.

FIG. 1 is a sectional view illustrating a semiconductor package according to some example embodiments of the inventive concepts. FIGS. 2, 3, and 4 are enlarged sectional views, each of which illustrates a region A of FIG. 1. FIGS. 5, 6, and 7 are plan views, each of which illustrates a semiconductor package according to some example embodiments of the inventive concepts, and FIG. 1 corresponds to a section taken along a line I-I' of each of FIGS. 5 to 7. FIG. 8 is a plan view illustrating a first molding portion of FIG. 1.

Referring to FIG. 1, a semiconductor package 10a may have a package-on-package (POP) structure. As an example, the semiconductor package 10a may include a lower package 100 and an upper package 300 mounted on the lower package 100. The upper package 300 may be electrically coupled to the lower package 100 through an interposer substrate 200 provided between the lower package 100 and the upper package 300.

The lower package 100 may include a first package substrate 110, a first semiconductor chip 120 mounted on the first package substrate 110, and a first molding portion 130 provided on the first package substrate 110 such that the first molding portion 130 covers the first semiconductor chip 120.

The first package substrate 110 may be provided. The first package substrate 110 may include a printed circuit board (PCB). In some example embodiments, the first package substrate 110 may have a multi-layered structure including insulating and interconnection layers, which are alternatingly stacked. The first package substrate 110 may include first substrate pads 112 and second substrate pads 114, which are provided on its top surface.

Outer terminals 118 may be disposed below the first package substrate 110. In detail, the outer terminals 118 may be disposed on terminal pads (not shown), which are disposed on a bottom surface of the first package substrate 110. The outer terminals 118 may include solder balls or solder bump, and depending on the kind of the outer terminals 118, the semiconductor package 10a may be one of ball grid array (BGA), fine ball-grid array (FBGA), and land grid array (LGA) structures.

The first semiconductor chip 120 may be mounted on the top surface of the first package substrate 110. For example, the first semiconductor chip 120 may be coupled to the first substrate pads 112 of the first package substrate 110 in a flip-chip bonding manner. For example, the first semiconductor chip 120 may be electrically connected to the first package substrate 110 through first chip terminals 122 (e.g., solder balls or solder bumps). Here, a space between the first semiconductor chip 120 and the first package substrate 110 may be filled with a flux 124. However, the inventive concepts is not limited to this example, and the first semiconductor chip 120 may be electrically connected to the first package substrate 110 through various interconnection elements (e.g., bonding wires). Hereinafter, the expression "an element A is electrically connected to an element B" may be used in the context that the element A is directly or indirectly connected to the element B. The first semiconductor chip 120 may be a logic chip or a memory chip. For example, the memory chip may be DRAM, NAND flash, NOR flash, PRAM, ReRAM, or MRAM chip. In some example embodiments, the first semiconductor chip 120 may serve as a non-memory chip, such as an application processor. The first semiconductor chip 120 may be electrically connected to the outer terminals 118 through the first package substrate 110. FIG. 1 illustrates an example, in which the semiconductor package 10a includes one first semiconductor chip 120, but in some example embodiments, the semiconductor package 10a may include a plurality of first semiconductor chips 120.

An interposer substrate 200 may be disposed (e.g., may be stacked) on the first semiconductor chip 120. The interposer substrate 200 may include an insulating substrate. For example, the interposer substrate 200 may be formed of or include an insulating material. The interposer substrate 200 may include a printed circuit board (PCB). The interposer substrate 200 may be formed of the same material (e.g., a same insulating material) as the first package substrate 110. The interposer substrate 200 may be attached to a top surface of the first semiconductor chip 120. A width of the interposer substrate 200 may be greater than a width of the first semiconductor chip 120. In this case, the interposer substrate 200 may include a portion, which is outward extended beyond a boundary of the first semiconductor chip 120 when viewed in a plan view, for example as shown in FIGS. 1 and 5-10. The interposer substrate 200 may include third substrate pads 202 and fourth substrate pads 204, which are disposed on its top surface. The fourth substrate pads 204 may be disposed on an outer region OR of the interposer substrate 200, and the third substrate pads 202 may be disposed on a center region CR of the interposer substrate 200. The interposer substrate 200 may be mounted on the first package substrate 110. The interposer substrate 200 and the first package substrate 110 may be electrically connected to each other through one or more connection terminals included in the semiconductor package 10a. For example, the interposer substrate 200 may be mounted on the first package substrate 110 in a wire bonding manner. In other words, the connection terminal included in the semiconductor package 10a may include the bonding wire 220 that connects the interposer substrate 200 to the first package substrate 110, and the interposer substrate 200 may be electrically connected to the first package substrate 110 through a bonding wire 220. As shown, the bonding wire 220 may extend from a top surface of the interposer substrate 200 to a top surface of the first package substrate 110, and an end of the bonding wire 220 which is coupled to the interposer substrate 200, may be vertically overlapped (e.g., may overlap in the direction extending perpendicular to the upper surface of the first package substrate 110) with the supporting portion SP. The bonding wire 220 may connect the fourth substrate pads 204 of the interposer substrate 200 to the second substrate pads 114 of the first package substrate 110.

A supporting portion SP may be interposed between the interposer substrate 200 and the first package substrate 110. The supporting portion SP may be disposed near the first semiconductor chip 120, when viewed in a plan view. The supporting portion SP may be spaced apart from (e.g., isolated from direct contact with) the first semiconductor chip 120, for example, as shown in FIG. 1, being spaced apart from (e.g., isolated from direct contact with) one or more side surfaces of the first semiconductor chip 120. The supporting portion SP may be positioned between the first substrate pads 112 and the second substrate pads 114, which are respectively coupled to the first semiconductor chip 120 and the bonding wire 220. The outer region OR of the interposer substrate 200 may be supported by the supporting portion SP, which is provided on the first package substrate 110. In the case where the interposer substrate 200 is formed of a material (e.g., PCB) having low stiffness, the outer region OR of the interposer substrate 200, which is not overlapped with the first semiconductor chip 120, may be bent by the gravity or an external pressure. According to some example embodiments of the inventive concepts, the supporting portion SP of the semiconductor package 10a may support the outer region OR of the interposer substrate 200 upward (e.g., away from the first package substrate 110). Accordingly, it will be understood that the supporting portion SP may be configured to support (e.g., structurally support the structural load, or weight, of) the interposer substrate 200 on (e.g., over) the first package substrate 110, for example such that a transfer of the structural load of the interposer substrate 200 to and/or through the first semiconductor chip 120 is reduced or prevented. Accordingly, it may be possible to prevent the outer region OR of the interposer substrate 200 from being bent in a downward direction and to prevent or suppress the interposer substrate 200 from being damaged by an external pressure or the like. In other words, the interposer substrate 200 may be robustly disposed on the first package substrate 110, and the structural stability of the semiconductor package 10a may be improved. The supporting portion SP, and thus the first and second supporting portions 116 and 210, may be placed below (e.g., underneath, vertically overlapping with, etc.) the fourth substrate pads 204 to which the bonding wires 220 are coupled (e.g., between the fourth substrate pads 204 and the first package substrate 110 in a vertical direction extending perpendicular to a top surface of the first package substrate 110). Thus, the interposer substrate 200 may be prevented from being bent, when the bonding wires 220 is connected to the fourth substrate pads 204. This will be described in more detail with reference to a fabrication method below.

The supporting portion SP may include a first supporting portion 116 and a second supporting portion 210. Hereinafter, the structure of the supporting portion SP will be described in more detail with reference to FIGS. 2 to 4.

Referring to FIGS. 1 and 2, the first supporting portion 116 may have a shape protruding from the top surface of the first package substrate 110 in an upward direction, for example protruding from the first package substrate 110 towards an outer region of the interposer substrate 200, as shown in at least FIGS. 1-2. In detail, the first supporting portion 116 may be a portion of the first package substrate 110, which is extended from the first package substrate 110 toward the outer region OR of the interposer substrate 200. For example, the first supporting portion 116 may be continuously connected to the first package substrate 110, such that the first supporting portion 116 and the interposer first package substrate 110 may be part of a single, continuous piece of material, and there may be no visible interface IF1 between the first supporting portion 116 and the first package substrate 110. For example, the first supporting portion 116 may be formed of the same material as an insulating portion of the first package substrate 110, and there may be no interface between the first supporting portion 116 and the first package substrate 110. In other words, the first supporting portion 116 and the first package substrate 110 may be provided as a single object.

The second supporting portion 210 may have a shape protruding from a bottom surface of the interposer substrate 200 in a downward direction, for example protruding from the an outer region of the interposer substrate 200 towards the first package substrate 110, as shown in at least FIGS. 1-2. In detail, the interposer substrate 200 may be a portion of the interposer substrate 200, which is extended from the outer region OR of the interposer substrate 200 toward the first package substrate 110. For example, the second supporting portion 210 may be continuously connected to the interposer substrate 200, such that the second supporting portion 210 and the interposer substrate 200 may be part of a single, continuous piece of material, and there may be no visible interface IF2 between the second supporting portion 210 and the interposer substrate 200. For example, the second supporting portion 210 may be formed of the same material as an insulating portion of the interposer substrate 200, and there may be no interface between the second supporting portion 210 and the interposer substrate 200. In other words, the second supporting portion 210 and the interposer substrate 200 may be provided as a single object.

The first supporting portion 116 and the second supporting portion 210 may be overlapped with each other, when viewed in a plan view. A top surface of the first supporting portion 116 may be in contact with a bottom surface of the second supporting portion 210, and thus the first supporting portion 116 and the second supporting portion 210 may be understood to be in contact with each other vertically. The first supporting portion 116 may support the second supporting portion 210 in an upward direction. A width W1 of the first supporting portion 116 may be greater than a width W2 of the second supporting portion 210. However, the inventive concepts is not limited to this example, and in some example embodiments, the width W1 of the first supporting portion 116 may be equal to the width W2 of the second supporting portion 210.

In some example embodiments, the supporting portion SP may include one of the first supporting portion 116 and the second supporting portion 210.

As shown in FIG. 3, the supporting portion SP may include a second supporting portion 210' but may not include the first supporting portion 116 (e.g., see FIG. 3). The second supporting portion 210', which may be a portion of the interposer substrate 200, may be extended (may protrude) from the outer region OR of the interposer substrate 200 toward the top surface of the first package substrate 110, and a bottom surface of the second supporting portion 210' may be in contact with the top surface of the first package substrate 110.

In some example embodiments, as shown in FIG. 4, the supporting portion SP may include a first supporting portion 116' but may not include the second supporting portion 210 (e.g., see FIG. 3). The first supporting portion 116', which may be a portion of the first package substrate 110, may be extended (e.g., may protrude) from the top surface of the first package substrate 110 toward the outer region OR of the interposer substrate 200, and a top surface of the first supporting portion 116' may be in contact with the bottom surface of the interposer substrate 200. The following description will be given, based on the structure of FIG. 2.

The supporting portion SP may have various shapes, when viewed in a plan view. As an example, the supporting portion SP may be disposed below the fourth substrate pads 204 of the interposer substrate 200, and the supporting portion SP may have a planar shape that depends on the interconnection structure of the interposer substrate 200. In some example embodiments, the supporting portion SP may be provided in a region, in which the fourth substrate pads 204 are not provided. Hereinafter, the structure of the supporting portion SP will be described in more detail with reference to FIGS. 5 to 7.

Referring to FIGS. 1 and 5, the fourth substrate pads 204 may be provided along the outer region OR of the interposer substrate 200. The supporting portion SP may be disposed below the fourth substrate pads 204. In other words, the supporting portion SP may be disposed below the outer region OR of the interposer substrate 200. The supporting portion SP (e.g., both the first and second supporting portions 116 and 210) may be spaced apart from first side surfaces 120a and second side surfaces 120b of the first semiconductor chip 120. Here, the first side surfaces 120a may be side surfaces of the first semiconductor chip 120, which are opposite to each other in a first direction D1, and the second side surfaces 120b may be side surfaces of the first semiconductor chip 120, which are opposite to each other in a second direction D2. The supporting portion SP may be provided to enclose the first semiconductor chip 120, when viewed in a plan view. The supporting portion SP may enclose the first and second side surfaces 120a and 120b of the first semiconductor chip 120. Some of the supporting portions SP may be line-shaped structures extending along third side surfaces 200a of the interposer substrate 200 or in the second direction D2 (e.g., in a direction that is parallel to a side surface 120a or 120b of the first semiconductor chip 120 and a top surface of the first package substrate 110), and others of the supporting portions SP may be line-shaped structures extending along fourth side surfaces 200b of the interposer substrate 200 or in the first direction D1. Here, the third side surfaces 200a may be side surfaces of the interposer substrate 200, which are opposite to each other in the first direction D1, and the fourth side surfaces 200b may be side surfaces of the interposer substrate 200, which are opposite to each other in the second direction D2. In some example embodiments, as shown in FIG. 5, the supporting portion SP may include a plurality of supporting portions SP, each of which is disposed to face a corresponding one of the first and second side surfaces 120a and 120b of the first semiconductor chip 120. In other words, the supporting portions SP may be disposed adjacent to the third and fourth side surfaces 200a and 200b of the interposer substrate 200. Unlike that illustrated in the drawings, the supporting portion SP may be provided as a single object enclosing the first semiconductor chip 120. For example, the supporting portion SP may have a ring-shape structure, when viewed in a plan view.

In some example embodiments, the supporting portions SP may be disposed on only the first side surfaces 120a of the first semiconductor chip 120.

Referring to FIGS. 1 and 6, the supporting portions SP may be spaced apart from the first semiconductor chip 120 in the first direction D1. The supporting portions SP may be extended along the first side surfaces 120a of the first semiconductor chip 120, which face the supporting portions SP, or in the second direction D2. For example, the supporting portions SP may be line-shape structures extending along the third side surfaces 200a of the interposer substrate 200 or in the second direction D2. The supporting portions SP may be disposed adjacent to the third side surfaces 200a of the interposer substrate 200. Unlike that illustrated in the drawings, the supporting portions SP may be locally disposed near one of the first and second side surfaces 120a and 120b of the first semiconductor chip 120, two side surfaces of the first semiconductor chip 120 that are not opposite to each other, or three side surfaces of the first semiconductor chip 120.

In some example embodiments, the supporting portions SP may have a pillar shape.

Referring to FIGS. 1 and 7, a plurality of supporting portions SP-1 may be provided, and each of the supporting portions SP-1 may have a pillar shape. The supporting portions SP-1 may be disposed on the third side surfaces 200a of the first semiconductor chip 120. The supporting portions SP-1 may be arranged along the third side surfaces 200a of the interposer substrate 200 and in the second direction D2. Accordingly, and as shown in FIG. 7, the supporting portions SP-1 (which may each include a separate first supporting portion 116-1 and a separate second supporting portion 210-1) may be arranged, and may be isolated from direct contact with each other, in a direction (e.g., the second direction D2) that is parallel to a first side surface 120a of the first semiconductor chip 120 facing the supporting portions SP-1 and a top surface of the first package substrate 110. Here, the supporting portions SP-1 may be spaced apart from each other. In other words, the supporting portions SP-1 may be arranged to be spaced apart from each other along the first side surfaces 120a of the first semiconductor chip 120, which face the supporting portions SP-1, or in the second direction D2. Here, each of the supporting portions SP-1 may be disposed below a corresponding one of the fourth substrate pads 204. For brevity's sake, the following description will be given, based on the structure of FIG. 5.

Referring further to FIG. 1, an adhesive layer 230 may be provided between the first semiconductor chip 120 and the interposer substrate 200 (e.g., between a top surface of the first semiconductor chip 120 and a bottom surface of the interposer substrate 200). The adhesive layer 230 may be in contact with the top surface of the first semiconductor chip 120 and the bottom surface of the interposer substrate 200. The adhesive layer 230 may be used to attach the first semiconductor chip 120 and the interposer substrate 200 to each other. Accordingly, the first semiconductor chip 120 and the interposer substrate 200 may be robustly attached to each other, and thus, the structural stability of the semiconductor package may be improved.

The first molding portion 130 may be provided on the first package substrate 110. The first molding portion 130 may be provided on the top surface of the first package substrate 110 to enclose the first semiconductor chip 120 and the interposer substrate 200, such that the first package substrate 110 and the interposer substrate 200 are embedded in the first molding portion 130. For example, the first molding portion 130 may cover the side surfaces of the first semiconductor chip 120, the side surfaces of the interposer substrate 200, and the top surface of the interposer substrate 200. Here, the first molding portion 130 may be provided to cover all of the outer and center regions OR and CR of the interposer substrate 200. Due to the first molding portion 130, the top surface of the interposer substrate 200 may not be exposed to the outside. In the case where the interposer substrate 200 has a structure laterally protruding from the first semiconductor chip 120, the first molding portion 130 may cover an exposed bottom surface of the protruding portion of the interposer substrate 200. In other words, the first molding portion 130 may be provided on the first package substrate 110 in such a way that the first semiconductor chip 120 and the interposer substrate 200 are embedded in the first molding portion 130. In some example embodiments, for example as shown in FIG. 8, the first molding portion 130 may cover an entire top surface of the interposer substrate 200 (e.g., an entirety of the top surface of the interposer substrate 200) and the connection terminal (e.g., bonding wire(s) 220).

As shown in FIG. 8, the first molding portion 130, even if covering an entire top surface of the interposer substrate 200 and the connection terminal (e.g., bonding wire(s) 220) may have a plurality of openings OP. The openings OP may be formed on the center region CR of the interposer substrate 200. The openings OP may be provided to vertically penetrate the first molding portion 130 and to expose the third substrate pads 202 of the interposer substrate 200, such that the third substrate pads 202 may be understood to be in separate, respective openings OP.

The upper package 300 may be provided on (e.g., above) the lower package 100 (e.g., on the interposer substrate 200), and may be directly or indirectly on the lower package 100. The upper package 300 may include a second package substrate 310, a second semiconductor chip 320, and a second molding portion 330.

The second package substrate 310 may be disposed on the interposer substrate 200. Here, the second package substrate 310 may be vertically spaced apart from (e.g., isolated from direct contact with, in the vertical direction) the first molding portion 130. A width of the second package substrate 310 may be equal to a width of the first package substrate 110 and a width of the first molding portion 130. For example, the second package substrate 310, the first package substrate 110, and the first molding portion 130 may have side surfaces that are placed on the same plane. The second package substrate 310 may be a printed circuit board (PCB) provided with signal patterns. In some example embodiments, the second package substrate 310 may have a multi-layered structure including insulating and interconnection layers, which are alternatingly stacked.

The second package substrate 310 may be mounted on the interposer substrate 200. For example, connection terminals 305 (also referred to herein as coupling terminals) may be disposed below the second package substrate 310. The connection terminals 305 may be provided to pass through the first molding portion 130 and may be coupled to the third substrate pads 202 of the interposer substrate 200. For example, the connection terminals 305 may be provided in the openings OP of the first molding portion 130. The connection terminals 305 may include solder balls or solder bumps. The connection terminals 305 may be understood to be between the upper package 300 and the interposer substrate 200 (e.g., between the interposer substrate 200 and the second package substrate 310) to connect the upper package 300 to the interposer substrate 200.

At least one second semiconductor chip 320 may be placed on the second package substrate 310. The second semiconductor chips 320 may be spaced apart from each other, when viewed in a plan view.

The second semiconductor chips 320 may be mounted on a top surface of the second package substrate 310. For example, the second semiconductor chips 320 may be mounted on fifth substrate pads 312 of the second package substrate 310 in a flip-chip bonding manner. For example, the second semiconductor chips 320 may be electrically connected to the second package substrate 310 through second chip terminals 322 (e.g., solder balls or solder bumps). However, the inventive concepts is not limited to this example, and in some example embodiments, the second semiconductor chip 320 may be electrically connected to the second package substrate 310 through various inter-connection elements (e.g., bonding wires). Each of the second semiconductor chips 320 may be a logic or memory chip. The second semiconductor chips 320 may be electrically connected to the outer terminals 118 of the first package substrate 110 through the second package substrate 310 and the interposer substrate 200. Although FIG. 1 illustrates an example, in which two second semiconductor chips 320 are provided, the semiconductor package 10a may be configured to include one second semiconductor chip 320 or three or more second semiconductor chips 320.

The second molding portion 330 may be provided on the second package substrate 310. In some example embodiments, the second molding portion 330 may be provided on the top surface of the second package substrate 310 to cover (e.g., at least partially enclose) the second semiconductor chips 320. For example, the second molding portion 330 may be provided on the second package substrate 310 in such a way that the second semiconductor chips 320 are embedded in the second molding portion 330.

Figure 9:
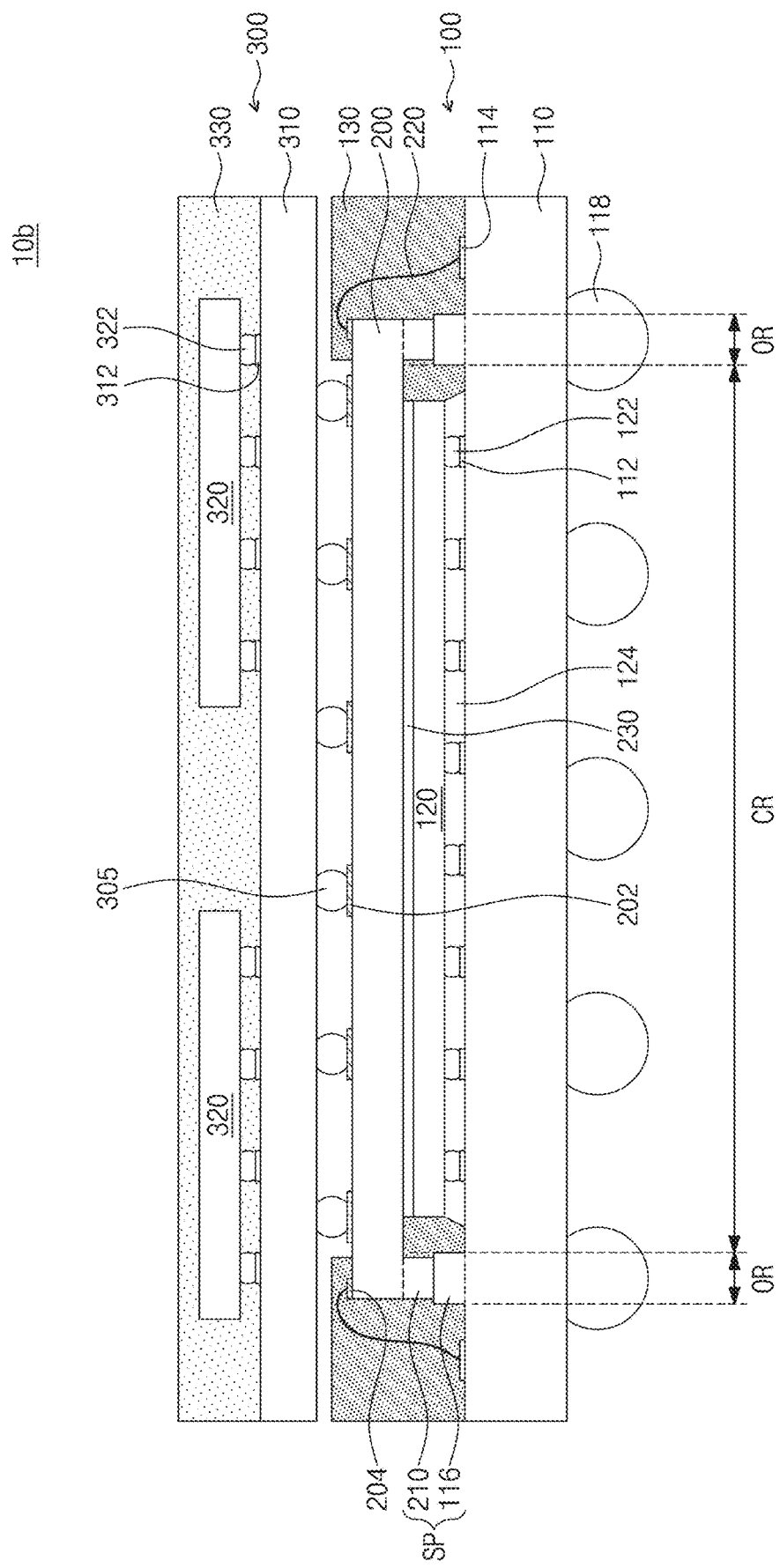
FIG. 9 is a sectional view illustrating a semiconductor package according to some example embodiments of the inventive concepts.
Figure 10:
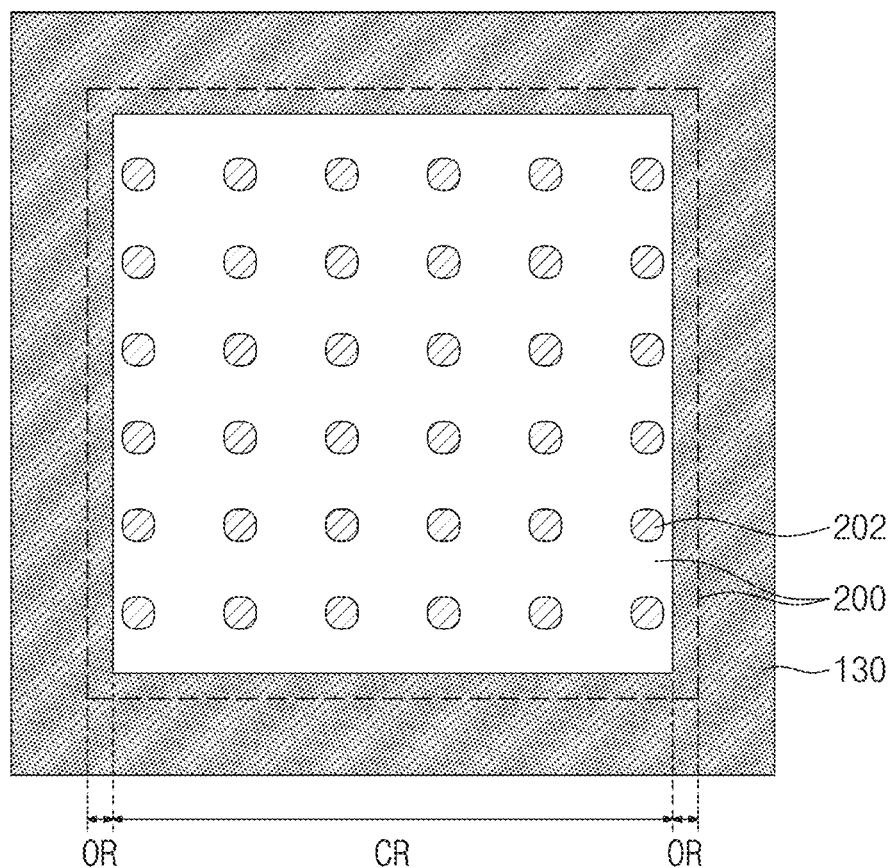
FIG. 10 is a plan view illustrating a first molding portion of FIG. 9.

FIG. 9 is a sectional view illustrating a semiconductor package according to some example embodiments of the inventive concepts. FIG. 10 is a plan view illustrating a first molding portion of FIG. 9. For concise description, an element previously described with reference to FIGS. 1 to 8 may be identified by the same reference number without repeating an overlapping description thereof.

Referring to FIGS. 9 and 10, the first molding portion 130 may be provided on the first package substrate 110. The first molding portion 130 may be provided on the top surface of the first package substrate 110 to enclose the first semiconductor chip 120 and the interposer substrate 200. For example, the first molding portion 130 may cover the side surfaces of the first semiconductor chip 120, the side surfaces of the interposer substrate 200, and the top surface of the interposer substrate 200. Here, the first molding portion 130 may be provided to cover the first package substrate 110, the outer region OR of the interposer substrate 200 and to allow the center region CR of the interposer substrate 200 to be exposed to the outside (e.g., to expose the center region CR). For example, the first molding portion 130 may be provided to allow the third substrate pads 202 as well as a top surface of the center region CR of the interposer substrate 200 to be exposed to the outside. In other words, all of the connection terminals 305 may be provided within a region delimited by the first molding portion 130, and the first molding portion 130 may not be provided in a region between the connection terminals 305.

FIGS. 11, 12, 13, 14, and 15 are sectional views illustrating a method of fabricating a semiconductor package, according to some example embodiments of the inventive concepts.

Figure 11:
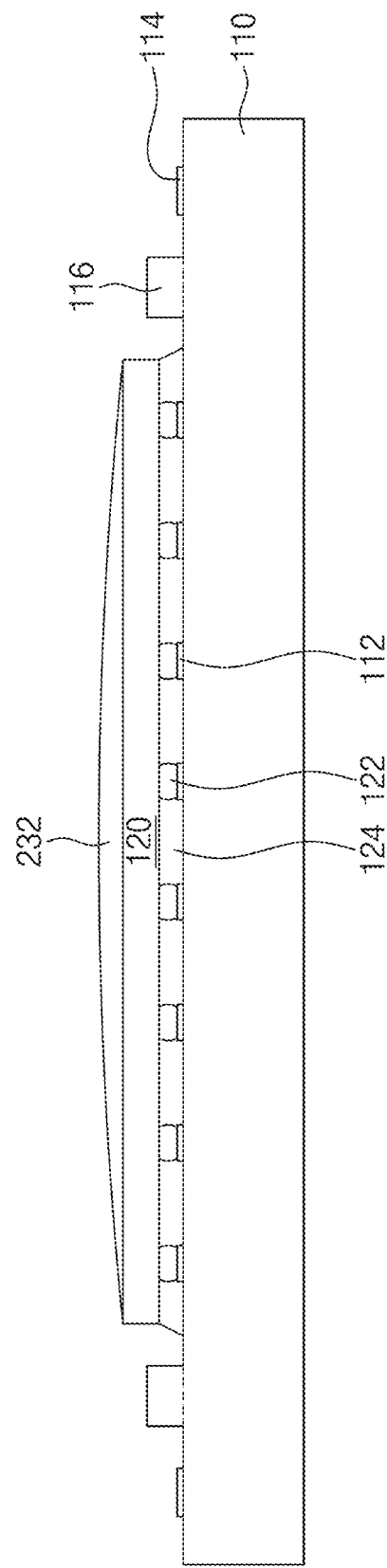
FIGS. 11, 12, 13, 14, and 15 are sectional views illustrating a method of fabricating a semiconductor package, according to some example embodiments of the inventive concepts.

Referring to FIG. 11, a lower package may be provided. In detail, the first package substrate 110 may be provided. The first package substrate 110 may include the first substrate pads 112, which are coupled to the first semiconductor chip 120 provided thereon, and the second substrate pads 114, which are coupled to the bonding wire 220. A portion of the first package substrate 110, which is located between the first substrate pads 112 and the second substrate pads 114, may be upward extended to form the first supporting portion 116.

The first semiconductor chip 120 may be mounted on the first package substrate 110. The first semiconductor chip 120 may be mounted on the first package substrate 110 in a flip-chip bonding manner. For example, the first semiconductor chip 120 may be coupled to the first substrate pads 112 of the first package substrate 110 through the first chip terminals 122. Thereafter, a space between the first semiconductor chip 120 and the first package substrate 110 may be filled with the flux 124. Here, the first supporting portion 116 may be used as a dam preventing the flux 124 from flowing toward the second substrate pads 114. Accordingly, it may be possible to reduce a failure ratio of the semiconductor package.

The top surface of the first semiconductor chip 120 may be coated with an adhesive agent 232. For example, the adhesive agent 232 may include a die attach film (DAF).

Figure 12:
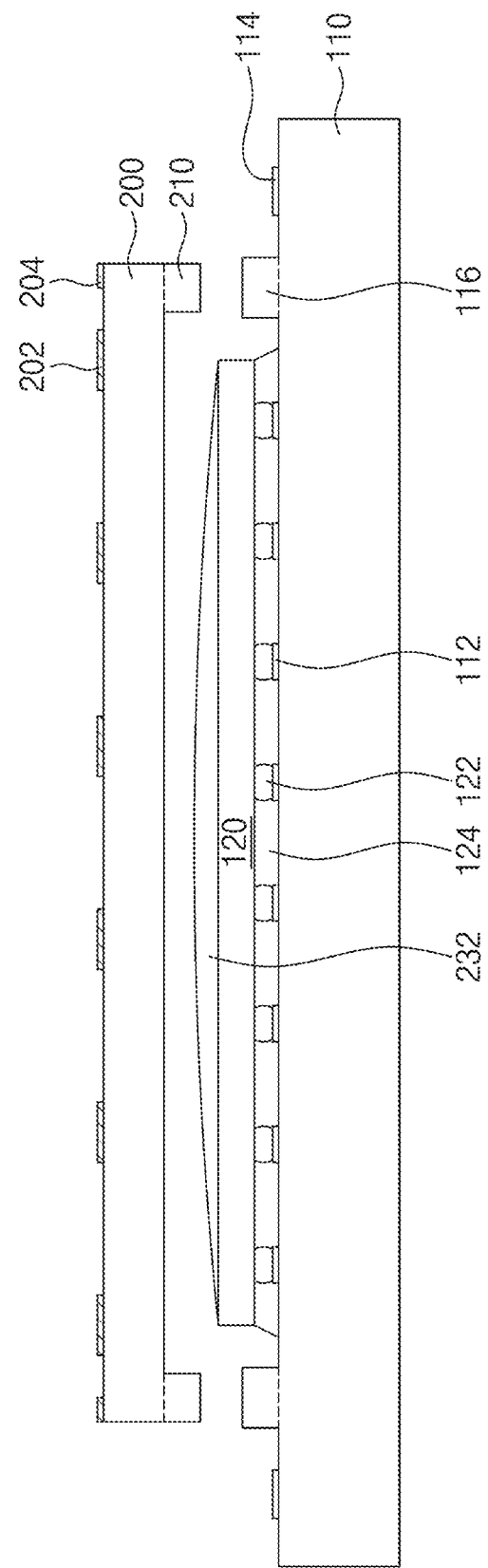

Referring to FIG. 12, the interposer substrate 200 may be provided. The interposer substrate 200 may include the third substrate pads 202, on which the upper package 300 (e.g., see FIG. 1) is mounted, and the fourth substrate pads 204, which are used to connect the interposer substrate 200 to the first package substrate 110. A portion of the interposer substrate 200, which is located below the fourth substrate pads 204, may be downward extended to form the second supporting portion 210. A width of the second supporting portion 210 may be smaller than a width of the first supporting portion 116.

The interposer substrate 200 may be provided on and aligned to the first package substrate 110. For example, the interposer substrate 200 may be disposed on the first package substrate 110 in such a way that the first supporting portion 116 and the second supporting portion 210 are vertically overlapped with each other.

Figure 13:
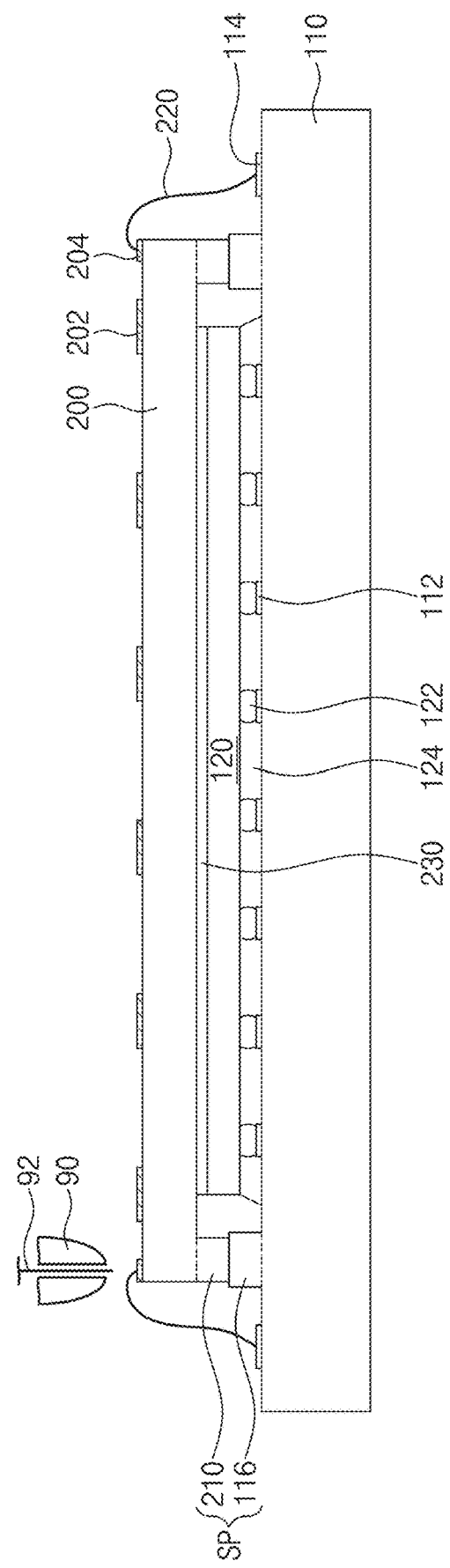

Referring to FIG. 13, the interposer substrate 200 may be attached to the top surface of the first semiconductor chip 120. For example, the interposer substrate 200 may be moved in a downward direction to be disposed near the first package substrate 110. The interposer substrate 200 may be attached to the first semiconductor chip 120 by the adhesive agent 232. The adhesive agent 232 may form the adhesive layer 230 attaching the bottom surface of the interposer substrate 200 to the top surface of the first semiconductor chip 120.

Due to the downward movement of the interposer substrate 200, the top surface of the first supporting portion 116 of the first package substrate 110 may be in contact with the bottom surface of the second supporting portion 210 of the interposer substrate 200. During the downward movement of the interposer substrate 200, the interposer substrate 200 may be horizontally moved on the first semiconductor chip 120 due to a process error or an external factor. According to some example embodiments of the inventive concepts, since the width of the first supporting portion 116 is greater than the width of the second supporting portion 210, the second supporting portion 210 may be stably placed on the first supporting portion 116, even when there is the horizontal movement of the interposer substrate 200. The first supporting portion 116 and the second supporting portion 210 may constitute the supporting portion SP, which is disposed on the top surface of the first package substrate 110 to support the outer region of the interposer substrate 200.

Thereafter, the interposer substrate 200 may be mounted on the first package substrate 110. The interposer substrate 200 may be connected to the first package substrate 110 in a wire bonding manner. For example, the fourth substrate pads 204 of the interposer substrate 200 and the second substrate pads 114 of the first package substrate 110 may be connected to each other through the bonding wires 220. For example, a capillary 90 may be used to eject a wire 92. The wire 92 ejected from the capillary 90 may be used as the bonding wire 220, which electrically connects one of the second substrate pads 114 to a corresponding one of the fourth substrate pads 204. During the process of forming the bonding wire 220, the outer region of the interposer substrate 200 may be downward bent by a downward force that is exerted on the fourth substrate pad 204 by the capillary 90. However, according to some example embodiments of the inventive concepts, since the supporting portion SP may be provided below the outer region of the interposer substrate 200 (in particular, below the fourth substrate pads 204) to support the interposer substrate 200, it may be possible to prevent the interposer substrate 200 from being bent or damaged by the capillary 90.

Figure 14:
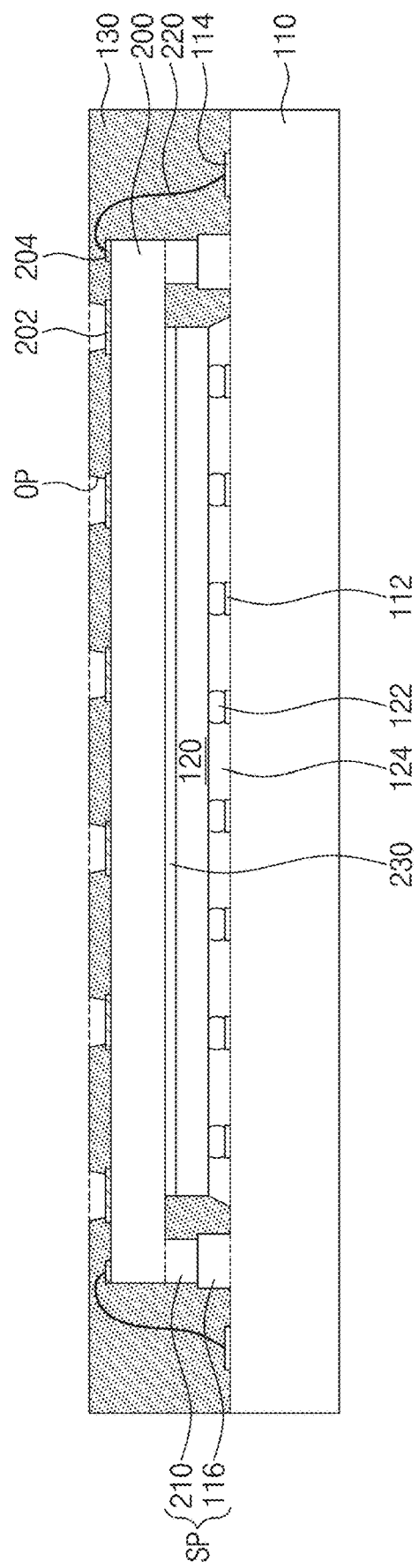

Referring to FIG. 14, the first molding portion 130 may be formed on the first package substrate 110. As an example, a molding member may be provided on the first package substrate 110. The molding member may cover the first semiconductor chip 120 and the interposer substrate 200. The molding member may be cured to form the first molding portion 130.

The openings OP may be formed in the first molding portion 130. For example, the openings OP may be formed by a mechanical drilling process. The openings OP may be formed to expose the third substrate pads 202, respectively.

In some example embodiments, the first molding portion 130 may be formed to partially cover the interposer substrate 200.

Figure 15:
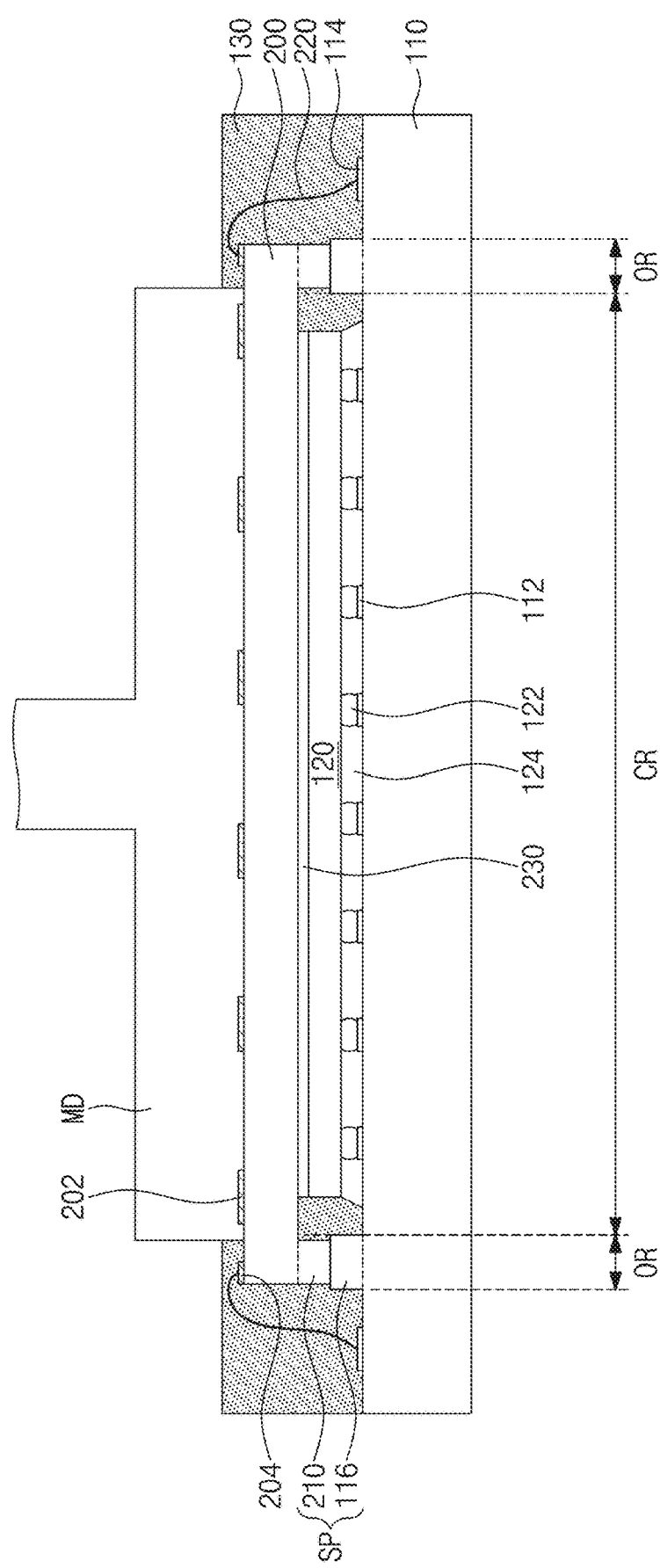

Referring to FIG. 15, a mold MD may be provided on the top surface of the interposer substrate 200. The mold MD may cover the center region CR of the interposer substrate 200 and may expose the outer region OR of the interposer substrate 200. Thereafter, a molding member may be provided on the first package substrate 110. The molding member may be provided to cover the first semiconductor chip 120 and the outer region OR of the interposer substrate 200. Due to the presence of the mold MD, the center region CR of the interposer substrate 200 may not be covered with the molding member. The molding member may be cured to form the first molding portion 130, and then, the mold MD may be removed. In this case, the semiconductor package may have the same structure as that described with reference to FIGS. 9 and 10. The following description will be given, based on the structure of FIG. 14.

Referring back to FIG. 1, the second package substrate 310 may be provided. The second semiconductor chips 320 may be mounted on the second package substrate 310. The mounting of the second semiconductor chips 320 may be performed in a flip-chip or wire-bonding manner. The second molding portion 330 may be formed by providing a molding member on the second package substrate 310 to cover the second semiconductor chips 320. As a result, the upper package 300 may be formed.

The upper package 300 may be placed on and aligned to the lower package 100. The connection terminals 305 may be provided between the upper package 300 and the lower package 100. The connection terminals 305 may include solder balls or solder bumps. The connection terminals 305 may be provided in the openings OP of the first molding portion 130 exposing the third substrate pads 202 of the interposer substrate 200. Thereafter, a reflow process may be performed on the connection terminals 305 to bond the second package substrate 310 to the interposer substrate 200. Here, the second package substrate 310 may be spaced apart from a top surface of the first molding portion 130. The semiconductor package 10a according to some example embodiments of the inventive concepts may be fabricated by the afore-described method.

According to some example embodiments of the inventive concepts, a semiconductor package may include a supporting portion, which is used to support an outer region of an interposer substrate upward. Accordingly, it may be possible to prevent the outer region of the interposer substrate, which is positioned outside a first semiconductor chip, from being bent downward and to prevent the interposer substrate from being damaged by an external pressure. In other words, the interposer substrate can be robustly disposed on the first package substrate, and the structural stability of the semiconductor package can be improved.

In a method of fabricating a semiconductor package according to some example embodiments of the inventive concepts, a first supporting portion of a first package substrate may serve as a dam, which prevents flux from flowing toward second substrate pads. Accordingly, it may be possible to reduce a failure ratio of the semiconductor package.

In addition, the supporting portion, which is used to support the interposer substrate, may be disposed below the outer region of the interposer substrate (in particular, below fourth substrate pads), and this may make it possible to prevent the interposer substrate from being bent or damaged during forming bonding wires using a capillary.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
   a lower package including a first substrate, a first semiconductor chip on the first substrate, and a first molding portion on the first substrate such that the first molding portion covers the first semiconductor chip;
   an interposer substrate on the first semiconductor chip;
   a supporting portion between the interposer substrate and the first substrate to support the interposer substrate on the first substrate;
   a connection terminal connecting the interposer substrate to the first substrate, wherein the connection terminal includes a bonding wire extending from a top surface of the interposer substrate to a top surface of the first substrate, and an end of the bonding wire, which is coupled to the interposer substrate, is vertically overlapped with the supporting portion; and
   an upper package on the interposer substrate, the upper package including a second substrate on the interposer substrate, a second semiconductor chip on the second substrate, and a second molding portion on the second substrate such that the second molding portion covers the second semiconductor chip,
   wherein the supporting portion includes a first supporting portion extending from the first substrate towards the interposer substrate and a second supporting portion extending from the interposer substrate towards the first substrate, and
   wherein at least one of the first supporting portion or the second supporting portion is a portion of a respective substrate, of the first substrate or the interposer substrate, from which the at least one of the first supporting portion or the second supporting portion extends.

2. The semiconductor package of claim 1, wherein
   the first supporting portion protrudes from the first substrate toward an outer region of the interposer substrate,
   the second supporting portion extends from the outer region of the interposer substrate toward the first substrate, and
   the first supporting portion and the second supporting portion are in contact with each other vertically.

3. The semiconductor package of claim 2, wherein a width of the first supporting portion is greater than a width of the second supporting portion.

4. The semiconductor package of claim 1, wherein the second supporting portion is a portion of the interposer substrate extending from an outer region of the interposer substrate toward the first substrate.

5. The semiconductor package of claim 1, wherein the first supporting portion is a portion of the first substrate protruding from the first substrate toward an outer region of the interposer substrate.

6. The semiconductor package of claim 1, wherein the first substrate and the interposer substrate are formed of a same insulating material.

7. The semiconductor package of claim 1, wherein the supporting portion is
   a line-shaped structure, which is extended along a side surface of the first semiconductor chip facing the supporting portion.

8. The semiconductor package of claim 1, wherein the supporting portion is isolated from direct contact with side surfaces of the first semiconductor chip.

9. A semiconductor package, comprising:
   a first substrate;
   a first semiconductor chip on the first substrate;
   an interposer substrate on the first semiconductor chip;
   a bonding wire, extending from a top surface of the interposer substrate to the first substrate;
   an upper package on the interposer substrate; and
   coupling terminals between the upper package and the interposer substrate,
   wherein the interposer substrate includes a first supporting portion, which is a portion of the interposer substrate and extends from an outer region of the interposer substrate toward the first substrate to support the interposer substrate on the first substrate,
   wherein an end of the bonding wire coupled to the interposer substrate is vertically overlapped with the first supporting portion, and
   wherein the first supporting portion is isolated from direct contact with a side surface of the first semiconductor chip.

10. The semiconductor package of claim 9, wherein the first substrate includes a second supporting portion, which is a portion of the first substrate and extends from a top surface of the first substrate toward the first supporting portion.

11. The semiconductor package of claim 10, wherein a width of the second supporting portion is greater than a width of the first supporting portion.

12. The semiconductor package of claim 9, wherein the first supporting portion has a line shape extending in a direction that is parallel to the side surface of the first semiconductor chip and a top surface of the first substrate.

13. The semiconductor package of claim 9, wherein the first supporting portion includes a plurality of first supporting portions, which are isolated from direct contact with each other in a direction that is parallel to the side surface of the first semiconductor chip and a top surface of the first substrate.

14. The semiconductor package of claim 9, further comprising:
   a molding portion, in which the first substrate and the interposer substrate are embedded,
   wherein the coupling terminals pass through the molding portion and are coupled to the interposer substrate.

15. A semiconductor package, comprising:
a lower package including a first substrate, a first semiconductor chip mounted on the first substrate, and a first molding portion on the first substrate such that the first molding portion covers the first semiconductor chip;
an interposer substrate on the first semiconductor chip;
an upper package on the interposer substrate, the upper package including a second substrate on the interposer substrate, a second semiconductor chip on the second substrate, and a second molding portion on the second substrate such that the second molding portion covers the second semiconductor chip;
a connection terminal between the interposer substrate and the second substrate to connect the upper package to the interposer substrate; and
a bonding wire connecting the interposer substrate to the first substrate,
wherein the first substrate includes a first supporting portion extending from a top surface of the first substrate toward an outer region of the interposer substrate,
wherein the interposer substrate includes a second supporting portion, which extends from the outer region of the interposer substrate toward the first substrate and is in contact with a top surface of the first supporting portion, and
wherein at least one of the first supporting portion or the second supporting portion is a portion of a respective substrate, of the first substrate or the interposer substrate, from which the at least one of the first supporting portion or the second supporting portion extends.

16. The semiconductor package of claim 15, wherein the first supporting portion and the second supporting portion are beneath, and are vertically overlapped with, a first substrate pad of the interposer substrate, to which the bonding wire is coupled.

17. The semiconductor package of claim 15, wherein the first supporting portion and the second supporting portion are isolated from direct contact with a side surface of the first semiconductor chip.

18. The semiconductor package of claim 15, wherein the second supporting portion includes a plurality of second supporting portions, which are isolated from direct contact with each other in a direction that is parallel to a side surface of the first semiconductor chip.

19. The semiconductor package of claim 15, wherein
the first molding portion covers the outer region of the interposer substrate and the bonding wire and exposes a center region of the interposer substrate, and
second substrate pads of the interposer substrate, to which the connection terminal is coupled, are on the center region of the interposer substrate exposed by the first molding portion.

\* \* \* \* \*